United States Patent [19]

Anthony et al.

[11] 3,904,442

[45] Sept. 9, 1975

[54] METHOD OF MAKING ISOLATION GRIDS IN BODIES OF SEMICONDUCTOR MATERIAL

[75] Inventors: Thomas R. Anthony; Harvey E. Cline, both of Schenectady, N.Y.

[73] Assignee: General Electric Company, Schenectady, N.Y.

[22] Filed: Oct. 30, 1973

[21] Appl. No.: 411,022

[52] U.S. Cl. ................. 148/1.5; 148/171; 148/172; 148/173; 148/186; 148/187; 148/188; 148/177; 148/179; 252/62.3 GA; 252/62.3 E; 357/48

[51] Int. Cl. ............................................. H01l 7/34

[58] Field of Search ..................... 148/1.5, 171–173, 148/186–188, 177, 179; 252/62.3 GA, 62.3 E; 357/48

[56] References Cited

UNITED STATES PATENTS 2,813,048 11/1957 Pfann ..................................... 148/1

*Primary Examiner*—G. Ozaki

*Attorney, Agent, or Firm*—Donald M. Winegar; Joseph T. Cohen; Jerome C. Squillaro

[57] ABSTRACT

An isolation grid is produced by the migration of metal-rich liquid zone of material through a body of semiconductor material. Planar orientation of the surface through which migration is initiated, directions of wire alignment in the surface, wire sizes, direction of wire migration and simultaneous migration of intersecting liquid wires are disclosed herein. P-N junctions of the grid produced behind the migrated wires have ideal voltage breakdown characteristics.

16 Claims, 7 Drawing Figures

METHOD OF MAKING ISOLATION GRIDS IN BODIES OF SEMICONDUCTOR MATERIAL

BACKGROUND OF THE INVENTION

1. Field of the Invention

This invention relates to P-N junction isolation grids for semiconductor devices and method of making of the same.

2. Description of the Prior Art

W. G. Pfann describes in "Zone Melting", John Wiley and Sons, Inc., New York (1966), a traveling solvent method to produce P-N junctions within the bulk of a semiconductor. In his method, either sheets or wires of a suitable metallic liquid are moved through a semiconductor material in a thermal gradient. Doped liquid-epitaxial material is left behind as the liquid wire migration progresses. For two decades, this process of temperature gradient zone melting has been practiced in an attempt to make a variety of semiconductor devices.

In our copending applications:

High Velocity Thermal Migration Method of Making Deep Diode Devices, Ser. No. 411,015; Deep Diode Device Having Dislocation Free P-N Junctions and Method, Ser. No. 411,009; Deep Diode Devices and Method and Apparatus, Ser. No. 411,001; Deep Diode Array Produced By Thermomigration of Liquid Droplets, Ser. No. 411,150; Large Scale Thermomigration Process, Ser. No. 411,021; and The Stabilized Droplet Migration Method of Making Deep Diodes Having Uniform Electrical Properties, Ser. No. 411,008; filed concurrently with this patent application and assigned to the same assignee of this application, we teach the stability of droplets, planar zones and line migrations and critical dimensions affecting the migration thereof. However, we have found that even with this available knowledge the formation of a P-N junction isolation grid is not a simple adaptation of the available knowledge we had developed.

Therefore, it is an object of this invention to provide a new and improved method of manufacturing a P-N junction isolation grid for semiconductor devices.

Another object of this invention is to provide a new and improved method for manufacturing a P-N isolation grid for semiconductor devices which correlates planar orientation of the surface of the semiconductor materials, directions of wires as disposed on the surface and the direction of the migration of the wires relative to the crystallography of the semiconductor material.

Other objects of this invention will, in part, be obvious and will, in part, appear hereinafter.

BRIEF DESCRIPTION OF THE INVENTION

In accordance with the teachings of this invention, there is provided a method for making a P-N junction isolation grid in a body of semiconductor material. The grid is comprised of a first group of planar regions, each of which are substantially parallel to each other and disposed a predetermined distance apart from each other and a second group of planar regions which are substantially parallel to each other, disposed a predetermined distance apart from each other and disposed at a preselected angle to at least one of the planar regions of the first group. The method comprises the process steps of disposing a first array of metal wires on a selected surface of a body of semiconductor material having a selected resistivity, a selected conductivity and a preferred planar crystal orientation. The vertical axis of the body is substantially aligned with a first axis of the crystal structure. The direction of the metal wires is oriented to substantially coincide with at least one of the other axes of the crystal structure. The body is heated to a temperature sufficient to form an array of liquid wires of metal-rich material on the surface of the body. A temperature gradient is established along substantially the vertical axis of the body and the first axis of the crystal structure. The array of metal-enriched semiconductor material is migrated through the body along the first axis of the crystal structure to form a plurality of planar regions of recrystallized material of the body. The planar regions so formed may be of the same, or different type conductivity than that of the body. In a similar manner, a second array of liquid metal-rich material is migrated through the body at a selected angle to the first array to produce a grid like structure in the body. Depending upon the planar orientation of the surface of the body, the orientation of the direction of the metal wires on the surface and the direction of the migration, the grid is produced by simultaneous migration of the intersecting lines or by a plurality of migrations of individual groups of metal wires.

DESCRIPTION OF THE INVENTION

Figure 1:
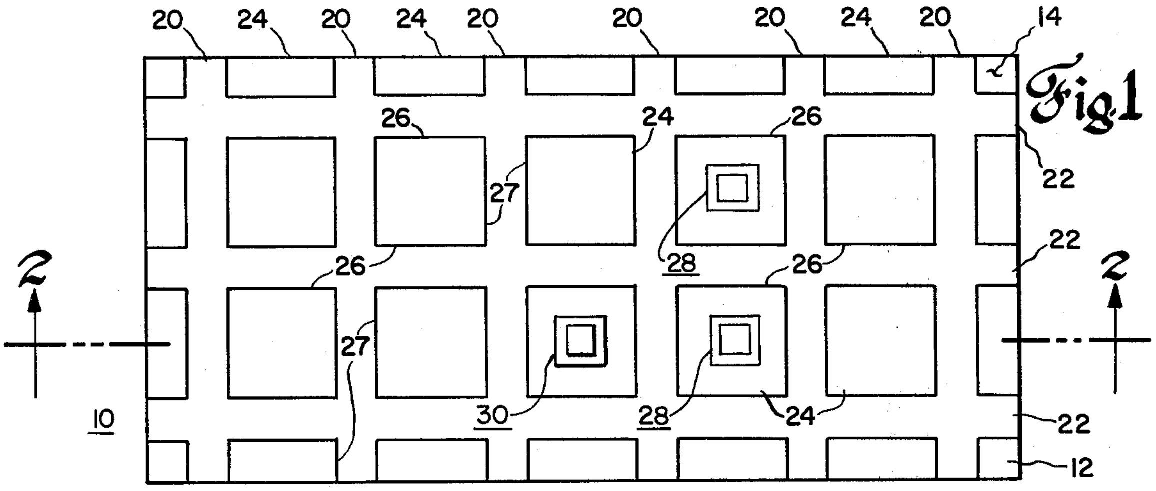
FIG. 1 is a top planar view of a P-N junction isolation grid made in accordance with the teachings of this invention.
Figure 2:
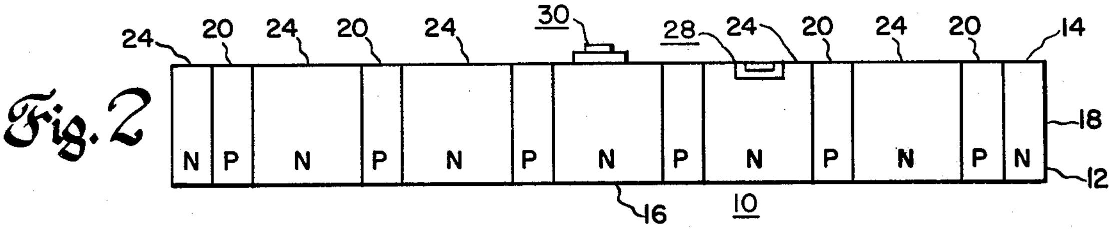
FIG. 2 is an elevation view, in cross-section of the grid of FIG. 1 taken along the cutting plane II—II.

Referring to FIGS. 1 and 2 there is shown a semiconductor device 10 comprising a body 12 of semiconductor material having a selected resistivity and a first type conductivity. The semiconductor material comprising the body 12 may be silicon, germanium, silicon carbide, or any other semiconductor material preferably having a diamond cubic crystal structure. The body 12 has two major surfaces 14 and 16, which define the top and bottom surfaces thereof respectively, and a peripheral side surface 18.

A plurality of first spaced planar regions 20 are disposed in the body substantially parallel to each other. Preferably, for semiconductor device fabrication, each of the regions 20 is oriented substantially perpendicular to the top and bottom surfaces, 14 and 16, respectively, and the peripheral side surface 18. Each of the regions 20 has a peripheral side surface which is coextensive with the respective surfaces 14, 16 and 18 of the body 12. A P-N junction 27 is formed by the contiguous surfaces of each region 20 and the immediately adjacent material of the body 12.

A plurality of second spaced planar regions 22 are sposed in the body 12 substantially parallel to each her. Preferably, for semiconductor device fabrica- on, each of the regions 22 is oriented substantially :rpendicular to the respective top and bottom sur- ces, 14 and 16 and the side surface. 18. In addition, ch of the regions 22 is preferably perpendicular to, d intersects one or more of the plurality of first aced planar regions 20. However, the regions 20 and ! may be at a preselected angle to each other. Each the second planar regions 22 has a peripheral side rface which is coextensive with the surfaces 14, 16 d 18 of the body 12. A P-N junction 26 is formed by e contiguous surfaces of each region 22 and the im- ediately adjacent material of the body 12. The inter- cting planar regions 20 and 22 define an egg-crate nfiguration which divides the body 12 into a plurality third regions 24 of first type conductivity electrically olated from each other.

Preferably, each of the regions 20 and 22 are of the me type conductivity, the conductivity being of a sec- d, and opposite type, than that conductivity of the dy 12 and the regions 24. Temperature gradient zone elting is the preferred process means for forming the gions 20 and 22 in the body 12. A temperature gradi- t of from 50°C per centimeter to 200°C per centime- for a migration temperature range of from 700°C to 50°C has been found to be suitable for the TGZM ocessing technique of this invention. The material of e planar regions 20 and 22 comprises recrystallized aterial of the body 12 having a concentration of an purity constituent which imparts the second, and op- site type, conductivity thereto. It is recrystallized aterial with solid solubility of the impurity. It is not a crystallized material with liquid solubility of the im- rity. Neither is it recrystallized material of eutectic. ch of the planar regions 20 and 22 has a substantially iform resistivity throughout its entire region. The dth of each of the regions 20 and 22 is substantially nstant over the entire region and is determined by latever photomasking geometry is used to define the gions 20 and 22. In particular, the body 12 is of sili- n semiconductor material of N-type conductivity and e regions 22 and 24 are aluminum doped recrystal- ed silicon to form the required P-type conductivity gions.

The P-N junctions 27 and 26 are well defined and ow an abrupt transition from one region of conduc- ity to the next adjacent region of opposite type con- ctivity. The abrupt transition produces a step P-N iction. Linearly graded P-N junctions 27 and 26 are tained by a post diffusion heat treatment of the grid ucture at a selected elevated temperature.

The plurality of planar regions 20 and 22 electrically late each region 24 from all of the remaining regions by the back-to-back relationship of the respective gments of the P-N junctions 27 and 26. The electrical lation achieved by this novel egg crate design ena- s one to associate one or more semiconductor de- es with one or more of the plurality of regions 24 of st type conductivity. The devices may be planar niconductor devices 28 formed in mutually adjacent gions 24 and/or mesa semiconductor devices 30 med on mutually adjacent regions 24 and still pro- t the electrical integrity of each device 28 or 30 hout disturbing the mutually adjacent devices. Devices 28 and 30 may, however, be electrically interconnected to produce integrated circuits and the like.

The spaced planar regions 20 and 22 besides offering excellent electrical isolation between mutually adjacent regions 24 have several other distinct advantages over prior art electrical isolation regions. Each of the regions 20 and 22 have a substantially constant uniform width and a substantially constant uniform impurity concentration for its entire length and depth. In addition, the planar regions 20 and 22 may be fabricated before or after the fabrication of the basic devices 28 and 30. Preferably, the regions 20 and 22 are fabricated after the highest temperature process step necessary for the fabrication of the devices 28 and 30 has been practiced first. This preferred practice limits, or substantially eliminates, any sideways diffusion of the impurity of the regions 20 and 22 which tends to increase the width of the regions 20 and 22 and thereby decrease the abruptness of the P-N junction and the transition between the opposite type conductivity regions. However, should a graded P-N junction be desired, a post-migration heat treatment may be practiced for a time sufficient to obtain the desired width of a graded P-N junction. Further, the planar regions 20 and 22 maximize the volume of the body 12 which can be utilized for functional electrical devices to a greater extent than can be achieved by prior art devices.

It has been discovered that one has to have a particular planar orientation of the surface of the body, a selected orientation of the direction of metal wires with respect to the planar orientation and to the axis of the crystal structure of the body along which migration of the wires is practiced.

Figure 3:
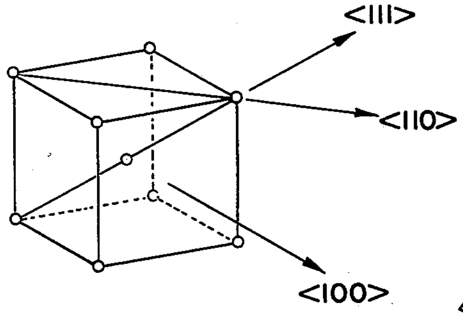
FIG. 3 is a diamond cubic crystal structure.

With reference to FIG. 3, for the diamond cubic crystal structure of silicon, silicon carbide, germanium, and the like, P-N junction grids are only produced in bodies of semiconductor material having two particular orientations of the planar region of the surface. These selected planar regions are the (100) plane and the (111) plane. The (100) plane is that plane which coincides with a face of the unit cube. The (110) plane is that plane which passes through a pair of diagonally opposite edges of the unit cube. Those planes which pass through a corner atom and through a pair of diagonally opposite atoms located in a face not containing the first mentioned atoms are generally identified as (111) planes. As a matter of convenience, directions in the unit cube which are perpendicular to each of these generic planes (X Y Z) are customarily referred to as the "crystal zone axis" of the particular planes involved, or more usually as the "<X Y Z> direction".

Figure 4:
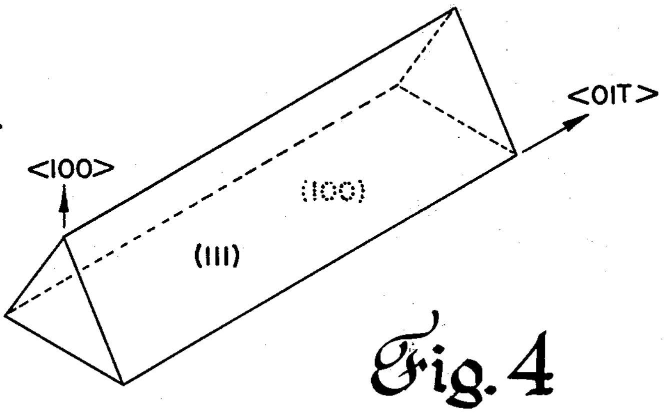
FIG. 4 is a morphological shape of wires which migrate stably in the <100> direction.

The crystal zone axis of the (100) generic plane will be referred to as the <100> direction and the crystal zone axis of the (111) plane as the <111> direction, and to the crystal zone axis of the (110) plane as the < 110> direction. Examples of these directions with respect to the unit cube are shown by the appropriately identified arrows in FIG. 3. In particular, for the (100) planar orientation, metal-rich wires of material can only be migrated stably in the <100> direction. In addition, only wires lying in the <011> and the $<0\bar{1}1>$ directions are stable in migration in the <100> axis direction. The morphological shape of these stable metal-rich wires of material is shown in FIG. 4. Solidliquid surface tension causes coarsening of the ends of the stable metal-rich liquid wires.

Although lying in the same (100) planar region, wires of metal-rich liquid, which by lying in directions other than the $\langle 011\rangle$ and $\langle 0\bar{1}1\rangle$ directions, are unstable and break up into a row of pyramidal square-base droplets of metal-rich liquid material because of severe faceting of the solid-liquid interface of wires lying in these directions. Thus, for example, wires lying in the $\langle 012\rangle$ and $\langle 02\bar{1}\rangle$ directions are unstable.

The dimensions of the metal wires also influence the stability of the metal wires. Only metal wires which are no greater than 100 microns in width are stable during the migration of the wires in the $\langle 100\rangle$ direction for a distance of at least one centimeter into the body of semiconductor material. Wire stability increases with decreasing wire size. The more the size of the liquid metal wire exceeds 100 microns, the less the distance that the liquid wire is able to penetrate the body during migration before the wire becomes unstable and breaks up.

a critical factor influencing the liquid metal wire stability during migration is the parallelism of the applied thermal gradient to either the $\langle 100\rangle$, $\langle 110\rangle$ or $\langle 111\rangle$ crystallographic directions. An offaxis component of the thermal gradient in general decreases the stability of the migrating liquid by causing tooth-like, or serrated, facets to develop in the side faces of the wire. When the tooth-like facets become too large, the wire breaks up and loses its continuity.

To fabricate the grid structure 10 of FIGS. 1 and 2 wherein the planar region is (100) and the migration direction is $\langle 100\rangle$, it is necessary to migrate a first array of liquid wires through the body 12 to form the regions 20 and then perform a second migration for a second array of liquid wires through the body 12 to form the second regions 22. Simultaneous migration of the liquid wires to form the regions 20 and 22 most often results in discontinuities in the grid structure. Investigation of the reasons for the discontinuities indicates that surface tension of the molten metal-rich material at the intersections of two migrating liquid wires is sufficiently great to cause discontinuities in the intersecting liquid wires. Apparently, the solid-liquid surface tension is sufficient for each portion of the intersecting migrating wires to cause the metal-rich liquid to remain with its own wire portion instead of being distributed uniformly throughout the intersection of the wires in the body 12. As a result, material of the body 12 at the advancing interface of the supposedly intersecting liquid wires does not become wetted by the liquid wires or even contacted by the liquid and therefore is not dissolved into the advancing metalrich liquid. therefore, discontinuity occurs at the intersection and further advancement of the liquid wires produces an imperfect grid. In instances where the discontinuity of the grid is present, mutually adjacent regions 24 are not electrically isolated from each other and may deleterious affect the reliability of electrical circuitry associated therewith.

Figure 5:
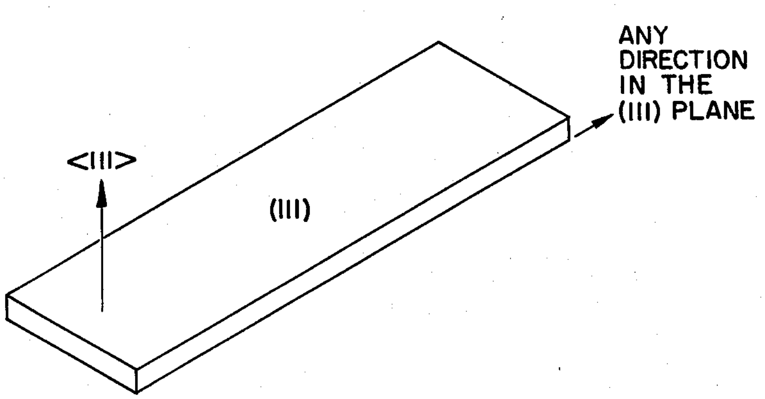
FIG. 5 is the morphological shape of wires which thermomigrate stably in the <111> direction.
Figure 6:
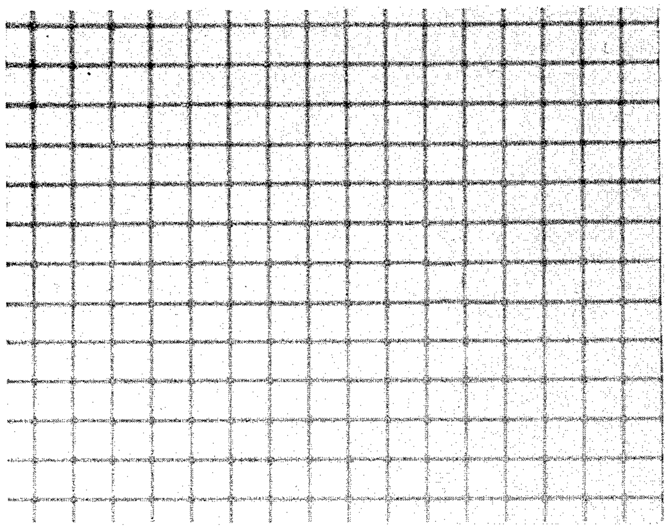
FIG. 6 is a top planar view of a grid on the entrance surface of a body of silicon processed in accordance with the teachings of this invention.
Figure 7:
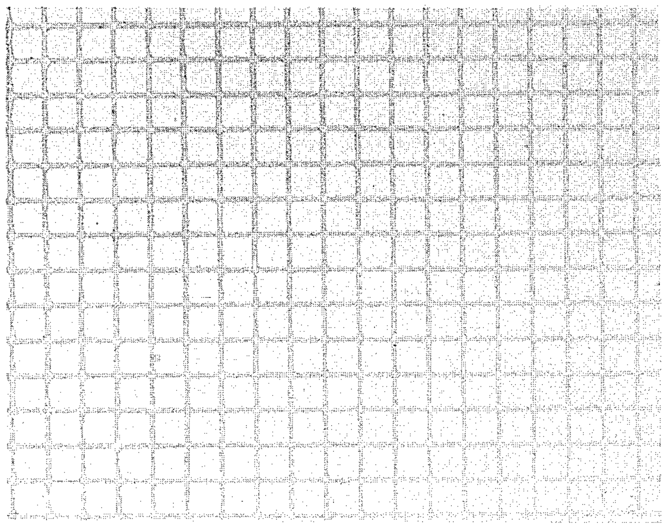
FIG. 7 is a bottom planar view of a grid on the exit surface of a body of silicon processed in accordance with the teachings of this invention.

The stability of wires lying in a (111) plane for the surface 14 and migrating in a $\langle 111\rangle$ direction through the body 12 to the surface 16 is not generally sensitive to the crystallographic direction of the wire. This general stability of wires lying in the (111) plane results from the fact that the (111) plane is the facet plane for the metal-rich liquid-semiconductor system. The morphological shape of a wire in the (111) plane is shown in FIG. 5 and the top and bottom surfaces are in the (111) plane. Therefore, both the forward and the rear faces of these wires are stable provided the wire does not exceed a preferred width.

The side faces of a wire lying in the (111) plane are not as equally as stable as the top and bottom surfaces. Edges of the side faces lying in $\langle 1\bar{1}0\rangle$, $\langle 10\bar{1}\rangle$ and the $\langle 01\bar{1}\rangle$ directions have (111) type planes as side faces. Consequently, these wires are stable to any sideways drift that may be generated should the thermal gradient be not substantially aligned along the $\langle 111\rangle$ axis. Other wire directions in the (111) plane such, for example, as the $\langle 11\bar{2}\rangle$ type wire directions develop serrations on their side faces if they drift sideways as the result of a slightly off axis thermal gradient. Eventually, the continuing migrating wire breaks up completely or bends into a $\langle 1\bar{1}0\rangle$ type line direction. Therefore, a reasonably well aligned thermal gradient permits thermal migration of $\langle 11\bar{2}\rangle$ type direction wires through at least bodies of semiconductor material 1 centimeter in thickness by the temperature gradient zone melting process without either breaking up of the wire or serrations of the edges of the migrating wire occurring.

In thermal migrating liquid wires through bodies of semiconductor material having an initial (111) wafer plane, the most stable wire directions are $\langle 01\bar{1}\rangle$, $\langle 10\bar{1}\rangle$ and $\langle 1\bar{1}0\rangle$. The width of each of these wires may be up to approximately 500 microns and still maintain stability during thermal migration. A triangular grid comprising a plurality of wires lying in the three wire directions $\langle 01\bar{1}\rangle$,$\langle 10\bar{1}\rangle$ and $\langle 1\bar{1}0\rangle$ is not readily obtainable by thermal migration embodying the temperature gradient zone melting (TGZM) process of all three wires simultaneously. The surface tension of the melt of metal-rich semiconductor material at the intersection of the three wire directions is sufficient to disrupt the line directions and result in an interruption of the grid structure. The grid, therefore, is preferably achieved by three separate TGZM processes embodying liquid wire migration of one wire direction at a time.

Wires of a $\langle 11\bar{2}\rangle$, $\langle \bar{2}11\rangle$ and $\langle 1\bar{2}1\rangle$ direction are less stable than the $\langle 01\bar{1}\rangle$, $\langle 10\bar{1}\rangle$ and $\langle 1\bar{1}0\rangle$ wire directions during thermal migration but more stable than any other wire directions in the (111) plane. The wires may have a width of up to 500 microns and still maintain their stability during thermal migration.

Any other wire direction in the (111) plane not disclosed heretofore may be thermomigrated through the body of semiconductor material. However, the wires of these wire directions have the least stability of all the wire directions of the (111) plane in the presence of an off axis thermal gradient. Wires of a width up to 500 microns are stable during migration for all wires lying in the (111) plane regardless of wire direction.

The perpendicular P-N junction isolation grid of FIGS. 1 and 2, or of any other configuration of intersecting planar regions, may be fabricated by the simultaneous migration of one of the wire directions $\langle 01\bar{1}\rangle$, $\langle 10\bar{1}\rangle$ and $\langle 1\bar{1}0\rangle$ and one of any of the remaining wire directions. Alternatively, the grid may be produced by migrating each wire direction separately.

A summation of the stable wire directions for a particular planar direction and the stable wire sizes are tabulated in the Table.

Table

| Wafer Plane | Migration Direction | Stable Wire Directions | | Stable Wire Sizes |
|---|---|---|---|---|
| (100) | $<100>$ | $<011>$* | | $<100$ microns |
| | | $<0\bar{1}1>$* | | $<100$ microns |
| (110) | $<110>$ | $<1\bar{1}0>$* | | $<150$ microns |
| (111) | $<111>$ | $<01\bar{1}>$<br>$<10\bar{1}>$<br>$<1\bar{1}0>$ | a | $<500$ microns |
| | | $<11\bar{2}>$*<br>$<\bar{2}11>$*<br>$<1\bar{2}1>$* | b | $<500$ microns |
| | | Any other* Direction in (111) plane | c | $<500$ microns |

*The stability of the migrating wire is sensitive to the alignment of the thermal gradient with the $<100>$, $<110>$ and $<111>$ axis, respectively.
Group a is more stable than group b which is more stable than group c.

The following example illustrates the teachings of this invention:

EXAMPLE

A body of a single crystal of silicon semiconductor material one inch in diameter, N-type, 10 ohm-centimeter resistivity, one centimeter in thickness of $<100>$ axial orientation was lapped and polished. A layer of silicon oxide was grown on the (100) planar surface. A square grid of line-array windows, 500 microns apart, and 50 microns each in width, were selectively etched in the silicon oxide employing photolithographic techniques well known to those skilled in the art and aligned with the $<0\bar{1}1>$ and $<011>$ wire directions. The line array was then etched through the silicon surface to a depth of 20 microns. A 20 micron-thick aluminum film was deposited from an electron beam source into the line array etched in the silicon. The excess aluminum overlying the oxide mask was ground off leaving etched line array grooves filled with aluminum to form the wires for migration. The processed body of silicon was placed in an electron beam migration apparatus designed to produce a very uniform vertical temperature gradient. A thermal gradient of 50°C per centimeter at 1200°C at a pressure of $1 \times 10^{-5}$ torr was employed to migrate the aluminum wires through the body. The excess aluminum was removed from the exit side of the body.

The entrance and exit surfaces of the body of silicon were polished and chemically stained by a solution of 33 parts HF, 66 parts $HNO_3$, 400 parts acetic acid and 1 part saturated $CuNO_3$ water solution by volume to reveal the P-type grid structure on both surfaces. The grid was well defined on both surfaces. There were no discontinuities in the grid. Electrical tests revealed the regions 24 were electrically isolated from each other. The regions 20 and 24 had a uniform resistivity of $8 \times 10^{-3}$ ohm-centimeter. The P-N junctions 27 and 26 had a breakdown voltage of 600 volts.

The processed body was sectioned to study the migration of the wires through the body at various depths. After polishing and chemical staining of the surfaces of the sections of the body, the grid structure was clearly defined on the entrance and exit surfaces of each section of the body. The grid was continuous throughout. The regions 24 were electrically isolated from each other. In addition, no appreciable changes were detected in the electrical characteristics of the regions 20 and 22 and the P-N junctions 27 and 26.

In addition to the preferred wire directions for the different planar orientations, we have discovered that any wire direction for the three planar orientations will migrate satisfactorily through a thin body of semiconductor material. The thin body preferably should not be greater than three or four times the preferred thickness of the layer of metal deposited on the surface of the body for the migration therethrough. Therefore, for the migration of aluminum through a thin body of silicon, the body should not be greater than approximately 100 microns in thickness.

In addition, thicker wires than the ones disclosed in the Table as being preferred, may be migrated through a thin body of semiconductor material. It has been found that metal wires may be migrated through a body of semiconductor material which has a thickness of from 3 to 4 times the thickness of the actual wire migrated therethrough. It has also been discovered that the migration of these metal wires may be practiced successfully because the wires do not have the sufficient distance of travel necessary to break up the liquid wire.

We claim as our invention:

1. A method for making an isolation grid comprising a first group of planar regions, each of which are substantially parallel to each other and a second group of planar regions which are substantially parallel to each other and at a selected angle to at least one of the planar regions of the first group in a body of semiconductor material comprising the process steps of:

a. disposing a first array of metal wires on a selected surface of a body of semiconductor material having a selected resistivity, a selected conductivity and a preferred planar crystal structure orientation, the vertical axis of the body being substantially aligned with a first axis of the crystal structure which is substantially perpendicular to the selected surface of the body and the direction of the metal wires being oriented to substantially coincide with at least one of the other axes of the crystal structure;

b. heating the body and the array of metal wires to a temperature sufficient to form an array of liquid wires of metal-rich semiconductor material on the surface of the body;

c. establishing a temperature gradient substantially parallel to the vertical axis of the body and the first axis of the crystal structure;

d. migrating the first array of metal-rich liquid wires through the body substantially aligned with the first axis of the crystal structure to form a plurality of first planar regions of recrystallized material of the body;

e. disposing a second array of metal wires on the selected surface of the body of semiconductor material, each of the wires being substantially perpendicular to the plane of one of the migrated metal wires of the first array;

f. heating the body and the second array of metal wires to a temperature sufficient to form a second array of liquid wires of metal-rich material;

g. establishing a temperature gradient substantially parallel to the vertical axis of the body, and h. migrating the second array of metal enriched semiconductor material wires through the body substantially aligned with the first axis of the crystal structure to form a plurality of second planar regions of recrystallized material of the body.

2. The method of claim 1 including the process step prior to disposing each of the arrays of metal wires in the selected surface of:

etching selectively the selected surface of the body having the preferred planar crystal structure orientation to form an array of lineal trough-like depressions in the surface in a preferred direction thereon.

3. The method of claim 1 wherein the semiconductor material of the body is one selected from the group consisting of silicon, silicon carbide and germanium.

4. The method of claim 3 wherein the semiconductor material is silicon having N-type conductivity, and the metal of the wire is aluminum.

5. The method of claim 4 wherein the temperature gradient is from 50°C to 200°C per centimeter, and the migration is practiced at a temperature of from 700°C to 1350°C.

6. The method of claim 3 wherein the preferred planar crystal orientation is (100), the metal wires of the first array are oriented in a stable wire direction which is at least one of the wire directions selected from the group consisting of $< 011 >$ and $< 0\bar{1}1 >$ and the wires are substantially parallel to each other, and the first axis along which migration is practiced is $< 100 >$.

7. The method of claim 2 wherein the preferred planar crystal orientation is (111), the metal wires of the first array are oriented in a stable wire direction which is one selected from the group consisting of $< 01\bar{1} >$, $< 1\bar{1}0 >$ and $< 10\bar{1} >$;

the metal wires of the second array are oriented in any remaining direction, and the direction of the first axis along which the migration is practiced is $< 111 >$.

8. The method of claim 7 wherein the metal wires of the first array are oriented in a stable wire direction which is one selected from the group consisting of $< 11\bar{2} >$, $< \bar{2}11 >$, and $< 1\bar{2}1 >$;

the metal wires of the second array are oriented in any remaining direction, and the direction of the first axis along which the migration is practiced is $< 111 >$.

9. The method of claim 8 wherein the semiconductor material is silicon having N-type conductivity, and the metal of the wire is aluminum.

10. The method of claim 7 wherein the semiconductor material is silicon having N-type conductivity, and the metal of the wire is aluminum.

11. The method of claim 7 including the process step prior to the disposing of each array of metal wires of etching selectively the selected surface of the body having the preferred planar crystal structure orientation to form an array of lineal trough-like depressions in the surface in a preferred direction thereon.

12. The method of claim 11 wherein the metal wires of the second array are oriented in a stable wire direction which is one selected from the group consisting of $<11\bar{2}>$, $<\bar{2}11>$, and $<1\bar{2}1>$.

13. The method of claim 12 wherein the semiconductor material is silicon having N-type conductivity, and the metal of the wire is aluminum.

14. The method of claim 11 wherein the semiconductor material is silicon having N-type conductivity, and the metal of the wire is aluminum.

15. The method of claim 1 wherein the body of semiconductor material is from three to four times the width of the stable wire.

16. The method of claim 1 wherein the width of the metal wire is no greater than 100 microns.

* * * * *